United States Patent [19]

Marcus et al.

[11] 4,091,325

[45] May 23, 1978

[54] VERIFICATION TECHNIQUE FOR CHECKING WRAPPED WIRE ELECTRONIC BOARDS

[75] Inventors: Ira R. Marcus, Rockville; Albert Lee, Takoma Park, both of Md.

[73] Assignee: The United States of America as represented by the Secretary of the Army, Washington, D.C.

[21] Appl. No.: 766,648

[22] Filed: Feb. 8, 1977

[51] Int. Cl.² .............................................. G01R 31/02
[52] U.S. Cl. ......................................... 324/51; 324/66
[58] Field of Search ................. 324/51, 66, 73, 73 PC

[56] References Cited

U.S. PATENT DOCUMENTS

| | | |
|---|---|---|
| 3,369,177 | 2/1968 | Graham et al. .......................... 324/66 |
| 3,471,778 | 10/1969 | Bennett et al. ................. 324/73 R X |
| 3,781,670 | 12/1973 | McMahon .................... 324/73 PC X |
| 3,788,911 | 1/1974 | Unger .................................. 324/51 X |

*Primary Examiner*—Gerard R. Strecker

*Attorney, Agent, or Firm*—Nathan Edelberg; Robert P. Gibson; Saul Elbaum

[57] ABSTRACT

A verification technique which greatly simplifies and facilitates the testing of the wiring of wrapped wire electronic boards. The technique contemplates continuity testing of each branch and discontinuity testing between successive branches. After a continuity test for one branch and a discontinuity test with the next succeeding branch, the two branches are then short-circuited. The procedure is repeated with each wired branch until all branches have been tested, whereupon the short-circuit wire may then be removed. The testing technique may be facilitated by utilizing a numerically controlled terminal locator in combination with a computer generated control tape. The technique also contemplates a visual check to verify that all pins on the board that are intended to be wired are indeed wired, and that all pins on the board which are not intended to be wired are indeed bare.

10 Claims, 2 Drawing Figures

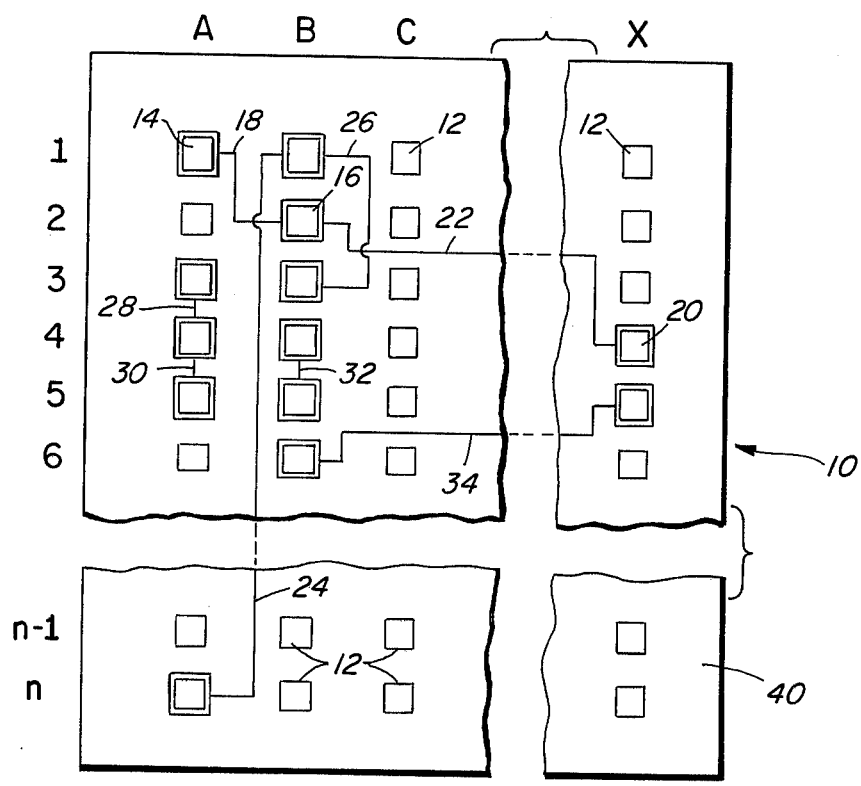

VERIFICATION TECHNIQUE FOR CHECKING WRAPPED WIRE ELECTRONIC BOARDS

BACKGROUND OF THE INVENTION

1. Field of the Invention

The present invention is related to wrapped wire electronic circuit boards and, more particularly, is directed toward a technique for verifying the wiring of such boards.

2. Description of the Prior Art

Wrapped wire electronic circuit boards are widely used in industry for mounting and interconnecting various electronic components. Typical wrapped wire electronic boards consist of a rigid substantially planar substrate which has a plurality of electrically conductive terminal pins or posts extending from one surface thereof. On the opposite surface of the board, means are provided for attaching various electronic components. The components are then electrically interconnected in a desired circuit configuration by hard-wiring the proper terminal posts or pins to one another.

Such wrapped wire electronic boards are preferred in place of conventional printed circuit boards in those instances where, for example, a prototype circuit is to be breadboarded, the production quantity of a particular circuit is relatively low, when wiring complexity is high and a double-sided printed circuit board is insufficient to accomplish the wiring objectives, when wiring changes are anticipated, and the like. For example, many computers utilize wrapped wire boards due to their flexibility and reliability.

Typical wrapped wire boards contain thousands of terminal posts or pins and have several hundreds of interconnecting wires. The wires may be connected between two terminals, or may be connected between a plurality of terminals, as the particular circuit configuration may dictate.

Wrapped wire boards may be wired either manually or with the assistance of a numerically controlled positioning machine. In such positioning machine, the board is mounted in a holder, and a paper tape controls the positioning of an X-Y indicator to point to successive terminals about which the wire is to be wrapped. The wire may then be manually or automatically wrapped about the indicated pin, and the machine will then step to the next pin in the sequence. The paper tape which controls the positioning machine is generated from a computer program which receives as input the coordinate pairs of pins which must be connected together. Typically, the program will act on the pairs of coordinates to generate a paper tape control which groups the wired pins into a plurality of branches, all of the pins within each branch being successively interconnected. In this manner, wiring of the board may be most efficiently effectuated.

After the board has been wired, it is necessary to inspect or test it in some manner for wiring accuracy. However, such inspections or tests are either extremely time-consuming or difficult to accomplish. One factor is simply the large total number of wires on the board, their high density placement, and the closeness of the pins to one another.

Those boards which are not checked for wiring accuracy, and which have components mounted thereon, run the risk of damaging the components, working improperly, and/or causing long delays to debug the circuit since it must be determined whether the malfunction is due to an electrical design flaw, a bad component, or an incorrectly wired board.

However, several techniques have been evolved for verifying the correctness of the wiring of wrapped wire boards, all of which, nevertheless, suffer from one or more deficiencies. The most obvious and reliable technique for testing the wired boards would be to verify that each pin is electrically connected to the pin(s) that it is supposed to be connected to, and is not electrically connected to all the other pins. For this test may be utilized a simple continuity tester which comprises a meter having two probes which are placed on the two pins whose continuity is to be tested. The meter will indicate whether a short or open circuit exists between the two pins. While extremely reliable, the process of considering each pin in order and testing it with all remaining pins is extremely tedious and time-consuming. In this technique, the number of tests required is $(T^2 - T)/2$, where T is the total number of pins. The impracticality of this technique becomes clear when one considers that for a relatively small wrapped wire board having one thousand pins, the technique would require 499,500 tests.

An abbreviated and alternative prior art technique simply requires that each branch, which may consist of either two or a plurality of pins, be tested for continuity by placing the probes on the first and last pins of the branch. This technique requires the wiring to be initially accomplished in a sequential or "chain" order, which is both an efficient and acceptable wiring procedure. This method is commonly referred to in the art as "buzzing out" a board, but is not a complete check since it fails to account for any short circuits that may inadvertently occur between branches. Further the technique does not test for the inadvertent wiring of extra wires to pins which were not to be wired at all.

It may therefore be appreciated that the prior art techniques for testing the wiring of wrapped wire electronic circuit boards suffer from complexity, high cost, incomplete testing, or long set-up times. There is therefore a great need for a simplified technique to accomplish such testing.

OBJECTS AND SUMMARY OF THE INVENTION

It is therefore a primary object of the present invention to provide a verification technique for checking wrapped wire electronic boards which overcomes all of the disadvantages noted above with respect to prior art techniques.

Another object of the present invention is to provide a novel and unique verification technique for checking the wiring of wrapped wire electronic circuit boards which is simple, inexpensive, leads to a complete test of the unit, and may be accomplished in a minimum amount of time.

The foregoing and other objects are obtained in accordance with one aspect of the present invention through the provision of a technique for verifying the hard wiring of wrapped wire electronic boards. Such boards generally comprise a substrate upon which are formed a plurality of electrically-conductive pins, groups of the pins being wired together to form a plurality of branches. Each of the branches comprises at least a first pin and a last pin electrically wired to one another, and the branches may contain a plurality of intermediate pins connected in series with the first and last pin. The technique of the present invention comprises the steps of first testing for electrical continuity between the first and last pin of the first branch. Then, a test is performed for electrical discontinuity (open circuit) between the first pin of the first branch and the first pin of a succeeding branch. The first pin of the first branch is then electrically shorted to the first pin of the succeeding branch, and then the first pin of the first branch and the last pin of the succeeding branch are tested for electrical continuity. The steps of testing for electrical discontinuity, shorting out the first pins, and then testing for electrical continuity are then repeated for each succeeding branch on the board.

In accordance with other aspects of the present invention, the technique includes the step of checking each of the pins on the board to verify that all pins which are supposed to be wired are indeed wired, and all pins which are supposed to be bare are indeed bare. After the successive tests are performed, the short-circuited first pins of each branch are then disconnected.

In accordance with more specific aspects of the present invention, the continuity and discontinuity testing may be performed by means of a continuity meter having a pair of probes. One probe is connected to the first pin of the first branch for the duration of the technique, while the second probe is successively placed on the last pin of one branch and the first pin of each succeeding branch.

BRIEF DESCRIPTION OF THE DRAWINGS

Various objects, features and attendant advantages of the present invention will be more fully appreciated as the same become better understood from the following detailed description of the present invention when considered in connection with the accompanying drawings in which:

FIG. 1 is a diagram which schematically illustrates a typical wrapped wire board which is useful in explaining the technique of the present invention; and FIG. 2 is a diagram illustrating the basic components of an electrical continuity meter which may be utilized in the present inventive technique.

DETAILED DESCRIPTION OF THE PREFERRED EMBODIMENT

The present inventive technique may be accomplished manually, but is preferably performed in conjunction with a numerically controlled terminal locator and an appropriate computer-generated control tape. Inasmuch as those persons skilled in this art readily appreciate the manner of using such a machine, as well as the manner of providing the machine with appropriate control tapes, the present technique will be described hereinafter in conjunction therewith.

In this context, the present technique is limited to those wrapped wire boards whose branches are sequentially or chain wired, i.e., a branch is defined by a first pin and a last pin and has all other pins in the branch series connected therebetween such that the two end pins may be tested for continuity and will determine the completeness of the branch. The sequential or chain wiring technique is relatively standard for both manual and numerically controlled wire wrapping.

Referring now to FIG. 1, reference numeral 10 indicates generally a typical wrapped wire board which consists of a substrate one side 40 of which has a plurality of electrically conductive terminal posts or pins 12 extending therefrom. The reverse side of the board 10 is the side to which the electronic components are mounted. Electrical interconnection of the various components is achieved by hard wiring various pins 12 together.

The pins are shown arranged in a plurality of columns A, B, C . . . X, and a plurality of rows 1, 2, 3, 4, 5, 6 . . . . n. Each pin 12 may be referred to by its column and row designation. Thus, reference numeral 14 indicates pin A1, reference numeral 16 indicates pin B2, and reference numeral 20 indicates pin X4.

FIG. 1 illustrates five branches which are formed on the board 10. The first branch consists of wire portions 18 and 22 which interconnect pins A1, B2 and X4, pins A1 and X4 respectively forming the first and last pins of this branch. Another branch is formed by wire portions 28 and 30 which respectively interconnect pins A3, A4 and A5. Another branch includes wire portions 24 and 26 which connect pins An, B1, and B3 in series, pins An and B3 forming the first and last pins in this branch.

Also, wire portion 32 forms a branch between pins B4 and B5, while wire portion 34 forms a branch between pins B6 and X5. The remaining pins, such as pins A2 and A6, may be assumed bare for the purposes of the present discussion.

The first step of the present technique preferably comprises a test to verify that all those pins on the board 10 which are not intended to be wired are indeed bare, and which incidentally provides a test that all those pins intended to be wired are indeed wired. To perform this test, a test tape may be generated by an appropriate computer program which contains the location of all pins which should have no wire going to them. The numerically controlled terminal locator machine may then be fed this test tape, and the indicator on the machine will successively point to those vacant pins. The operator may then visually verify that no wires are on that particular post. The terminal locator may be successively indexed by the operator or by a timing device to proceed to the next location, in sequence, by columns and/or rows. As the machine transits to the next location, the operator may visually verify that all intermediate points do indeed have wires on them. The conclusion of this phase of the technique of the present invention verifies the existence of all desired vacant pins, and all desired wired pins in the proper location.

Next, a control tape may be generated for the numerically controlled terminal locator which contains the location of the first and last terminals of each sequentially wired branch. For example, such a tape for the branches schematically illustrated in the board 10 of FIG. 1 would sequentially contain the location of the following pins: A1, X4; A3, A5; An, B3; and the like. Such a tape would facilitate the performance of the next step of the present inventive technique, as follows.

Utilizing a continuity meter, such as schematically illustrated in FIG. 2, or like device, the continuity between the first and last pins in each branch would be tested. The continuity meter of FIG. 2 comprises a pair of probes. During this phase of the technique, probe 1 is placed upon pin A1, and probe 2 is placed upon pin X4. Continuity (short circuit) is then indicated by the meter. By utilizing the numerically controlled terminal locator, the indicator would first position over pin A1, the operator would then attach probe 1 to pin A1, the locator would then position over pin X4, and the operator would then place probe to pin X4 and read the meter to test for continuity of the branch which consists of pins A1, B2, and X4. After confirming continuity of this branch, the operator or a timing device would then index the tape reader to the next block of information.

The next block of information would contain the location of the first pin of the second branch, i.e., pin A3. The operator will then test for shorts between the first and second branches by touching probe 2 to pin A3. Upon confirming that no short circuits (a discontinuity) exists, the operator then will manually short circuit pin A1 with pin A3.

Thereafter, the operator will index the tape reader to the next block of information which will direct the indicator to the last pin of the second branch, i.e., pin A5. The operator will touch probe 2 to pin A5 to confirm continuity between pin A1 and pin A5. This test, in effect, tests for continuity of the second branch. Upon confirming continuity, the operator then indexes the tape to the next block of information, which will contain the location of the first pin of the third branch, i.e., pin An.

The machine will then index to pin An, whereupon the operator will again place probe 2 upon pin An to insure the existence of an open circuit between the third branch and the previous two branches. Upon confirming the existence of an open circuit, the operator will then intentionally short circuit pin A3 to pin An, and will then index the locator to the next block of information which will contain the last pin of the third branch, i.e., pin B3, to which the numerically controlled terminal locator machine will then proceed.

Upon reaching this location, the operator will touch probe 2 of the continuity meter to pin B3 to test for continuity between pin A1 and pin B3 which, in effect, is a continuity test for the third branch consisting of pins An, B1 and B3. The machine will then index to pin B4, the first pin of the fourth branch, and the open circuit test, connection of the short circuit, and short circuit test will be repeated. The successive steps will then be repeated until all of the branches have been accounted for.

In this manner, the number of tests required to completely "buzz out" the board 10 is greatly reduced over the prior art techniques discussed above. When the board has been completely buzzed out, the short circuit wires between the first pins of each branch are then removed. Various tools may be utilized for shorting the first pins, such as conventional, hand-held battery operated wire wrapping tools. The function of the short circuits is to permit a single measurement to test for shorts between the presently tested branch and all previous branches. That is, in absence of such shorts, each branch would have to be tested against each other branch individually.

The advantages of the present technique are clear. If it is desired to utilize a numerically controlled terminal locator, the test control tape therefor can be readily produced by modifying the computer program which provides the initial wiring tape, as will be apparent to any person skilled in this art. Also, the number of tests required by the present technique are minimized. That is, for example, for an average one thousand pin configuration, approximately two hundred pins are vacant, and eight hundred pins are wired into branches with approximately four pins per branch. The test technique of the present invention would then require two hundred locations to be stored on a tape for the pins having no wires. This phase of the technique may be completed by a single traverse of all pins by the terminal locator machine. The branch completion and no short verification phases of the present technique would then require one hundred and ninety-nine no short tests, and two hundred branch completion tests, all of which may also be accomplished by a single traverse of the wrapped wire board, either manually or with the aid of the terminal locator machine. Clearly, no equipment is necessary other than a single conventional continuity tester, and preferably a terminal locator machine, if desired.

Obviously, numerous modifications and variations of the present invention are possible in light of the above teachings. One obvious modification would, for example, be to first short circuit each branch together all at once. Probe 1 of the continuity meter would be connected to the first pin of the first branch. Probe 2 would then be placed on the last pin of the last branch to check for continuity (a short circuit). The machine would then be indexed to the first pin of the last branch, whereupon the operator would disconnect the shorted wire from said first pin and then place probe 2 thereon to provide an open circuit indication. Then the machine would be indexed to the last pin of the next-to-last branch, and the continuity test would be performed by probe 2. In other words, this modification basically comprises the initially-described technique in reverse.

Therefore, it should be clearly understood that within the scope of the appended claims, the invention may be practised otherwise than as specifically described herein.

We claim as our invention:

1. A technique for verifying the hard wiring of wrapped wire electronic boards, said boards comprising a substrate upon which are formed a plurality of electrically-conductive pins, groups of said pins being wired together to form a plurality of branches, each of said branches comprising at least a first pin and a last pin electrically wired to one another, said technique comprising the steps of:
   a. testing for electrical continuity between the first pin and last pin of a first branch; then, after determining whether continuity does or does not exist,
   b. testing for electrical discontinuity between said first pin of said first branch and the first pin of a succeeding branch; upon ascertaining whether there is or is not discontinuity between the branches,
   c. electrically connecting said first pin of said first branch to said first pin of said succeeding branch;
   d. testing for electrical continuity between said first pin of said first branch and the last pin of said succeeding branch; and then, after finding if continuity does or does not exist in the succeeding branch,
   e. repeating the above steps b) through d) for each succeeding branch on the board.

2. The technique as set forth in claim 1, further comprising the step of electrically disconnecting said first pins of each branch after steps a) through e) have been performed.

3. The technique as set forth in claim 1, further comprising the step of checking each of said pins on said board to verify that all pins which are supposed to be wired are indeed wired, and all pins which are supposed to be bare are indeed bare.

4. The technique as set forth in claim 1, wherein said step a) comprises the steps of placing a first probe of an electrical continuity meter on said first pin of said first branch, placing a second probe of said meter on said last pin of said first branch, and verifying that a short-circuit exists between said first and last pins of said first branch.

5. The technique as set forth in claim 4, where in said first probe of said meter is maintained in electrical contact with said first pin of said first branch while said steps b) through e) are performed.

6. The technique as set forth in claim 5, wherein said step b) comprises the steps of placing said second probe on said first pin of said succeeding branch and verifying that an open-circuit exists between said first pin of said first branch and said first pin of said succeeding branch.

7. The technique as set forth in claim 6, wherein said step d) comprises the steps of placing said second probe on said last pin of said succeeding branch and verifying that a short-circuit exists between said first pin of said first branch and said last pin of said succeeding branch.

8. The technique as set forth in claim 7, further comprising the step of checking each of said pins on said board to verify that all pins which are supposed to be wired are indeed wired, and all pins which are supposed to be bare are indeed bare.

9. The technique as set forth in claim 8, further comprising the step of electrically disconnecting said first pins of each branch after steps a) through e) have been performed.

10. A technique for verifying the hard wiring of wrapped wire electronic boards, said boards comprising a substrate upon which are formed a plurality of electrically-conductive pins, groups of said pins being wired together to form a plurality of branches, each of said branches comprising at least a first pin and a last pin electrically wired to one another, said technique comprising the steps of:
   a. electrically connecting each of the first pins of each of said branches to one another;
   b. testing for electrical continuity between the first pin of the first branch and the last pin of the last branch; then, upon ascertaining whether there is or is not continuity between the branches,
   c. disconnecting the first pin of the last branch from the first pins of the remaining branches;
   d. testing for electrical discontinuity between the first pin of the last branch and the first pin of the first branch; and then, after determining if there is or is not any discontinuity between the branches,
   e. repeating the above steps b) through d) for each preceding branch on the board.

* * * * *